(12) United States Patent
Haynie

(10) Patent No.: US 12,027,845 B2
(45) Date of Patent: Jul. 2, 2024

(54) SHOOT THROUGH CURRENT DETECTION AND PROTECTION CIRCUIT

(71) Applicant: Aerojet Rocketdyne, Inc., Sacramento, CA (US)

(72) Inventor: Carl R. Haynie, Sacramento, CA (US)

(73) Assignee: AEROJET ROCKETDYNE, INC., Sacramento, CA (US)

( * ) Notice: Subject to any disclaimer, the term of this patent is extended or adjusted under 35 U.S.C. 154(b) by 211 days.

(21) Appl. No.: 17/792,226

(22) PCT Filed: Feb. 19, 2020

(86) PCT No.: PCT/US2020/018768
§ 371 (c)(1),
(2) Date: Jul. 12, 2022

(87) PCT Pub. No.: WO2021/167599
PCT Pub. Date: Aug. 26, 2021

(65) Prior Publication Data
US 2023/0039217 A1   Feb. 9, 2023

(51) Int. Cl.
*H02H 7/122*   (2006.01)
*G01R 19/165*   (2006.01)
(Continued)

(52) U.S. Cl.
CPC ..... *H02H 7/1225* (2013.01); *G01R 19/16571* (2013.01); *H02M 1/08* (2013.01); *H02M 1/38* (2013.01); *H03K 17/0822* (2013.01)

(58) Field of Classification Search
CPC ........ H02H 7/1225; H02H 3/066; H02H 3/08; H02H 5/005; H02H 1/0007;
(Continued)

(56) References Cited

U.S. PATENT DOCUMENTS 4,464,709 A * 8/1984 Barter ................. H02M 3/3385
363/56.08
5,063,332 A * 11/1991 El-Hamamsy ..... H05B 41/2806
315/48

(Continued)

FOREIGN PATENT DOCUMENTS

CN   202550538 U  * 11/2012
CN   114242406 A  *  3/2022
(Continued)

OTHER PUBLICATIONS

International Preliminary Report on Patentability for International Patent Application No. PCT/US20/18768 issued on Aug. 23, 2022.
(Continued)

*Primary Examiner* — Dharti H Patel
(74) *Attorney, Agent, or Firm* — Fox Rothschild LLP; Carol Thorstad-Forsyth

(57) ABSTRACT

A shoot-through protection circuit includes a current sensor providing a sensor signal connected to a comparator input via at least a burden resistor. A switch protection circuit including a protection input connected to an output of the comparator and a plurality of outputs. Each of the outputs is connected to a corresponding switch in a plurality of stacked switches. Wherein the switch protection circuit is configured to drive each switch of the plurality of stacked switches open in response to a positive output signal from the comparator.

16 Claims, 3 Drawing Sheets

(51) Int. Cl.
  *H02M 1/08* (2006.01)
  *H02M 1/38* (2007.01)
  *H03K 17/082* (2006.01)

(58) Field of Classification Search
  CPC .... G01R 19/16571; H02M 1/08; H02M 1/38; H02M 1/0009; H03K 17/0822; H03K 17/102; H03K 17/691
  USPC .................................................. 361/93.1, 87
  See application file for complete search history.

(56) References Cited

U.S. PATENT DOCUMENTS

| | | | | |
|---|---|---|---|---|
| 5,900,683 | A * | 5/1999 | Rinehart | H03K 17/567 |
| | | | | 307/129 |
| 6,570,345 | B1 * | 5/2003 | Munson | H05B 39/044 |
| | | | | 315/297 |
| 6,856,521 | B1 | 2/2005 | Chen et al. | |
| 7,859,210 | B2 | 12/2010 | Sakurai et al. | |
| 8,208,236 | B2 * | 6/2012 | Lin | H02M 1/32 |
| | | | | 361/18 |
| 8,928,363 | B2 * | 1/2015 | Hatanaka | H02M 1/38 |
| | | | | 363/55 |
| 9,979,272 | B2 | 5/2018 | Tezuka et al. | |
| 11,063,422 | B2 | 7/2021 | Ichimura | |
| 2003/0227280 | A1 * | 12/2003 | Vinciarelli | H02M 7/003 |
| | | | | 323/265 |
| 2012/0287545 | A1 * | 11/2012 | Tran | H02M 1/38 |
| | | | | 361/101 |
| 2013/0258731 | A1 * | 10/2013 | Xu | H02M 1/08 |
| | | | | 363/78 |
| 2015/0365003 | A1 * | 12/2015 | Sadwick | H02M 3/28 |
| | | | | 363/21.01 |
| 2019/0267901 | A1 * | 8/2019 | Oh | H02M 3/06 |
| 2023/0101061 | A1 * | 3/2023 | Fabbro | H03K 17/689 |
| | | | | 361/115 |

FOREIGN PATENT DOCUMENTS

| | | | | |
|---|---|---|---|---|
| EP | 2511690 | A2 * | 10/2012 | ......... G01N 15/0656 |
| EP | 3786735 | A1 * | 3/2021 | ......... G01R 19/2506 |
| JP | 2005-65497 | | 3/2005 | |
| JP | 2008-228547 | | 9/2008 | |
| JP | 2013038966 | A * | 2/2013 | |
| JP | 2016-178802 | | 10/2016 | |
| JP | 2019-97305 | | 6/2019 | |
| WO | WO-02061926 | A2 * | 8/2002 | ............. H02M 1/08 |
| WO | WO-2012177873 | A2 * | 12/2012 | ............. H02M 1/38 |
| WO | 2013/046420 | | 4/2013 | |
| WO | 2016/204122 | | 12/2016 | |

OTHER PUBLICATIONS

International Search Report and Written Opinion for International Patent Application No. PCT/US2020/018768 completed on Sep. 14, 2020.

* cited by examiner

SHOOT THROUGH CURRENT DETECTION AND PROTECTION CIRCUIT

STATEMENT REGARDING FEDERALLY SPONSORED RESEARCH OR DEVELOPMENT

This invention was made with government support under contract number NNC16CA21C awarded by NASA. The government has certain rights in the invention.

CROSS-REFERENCE TO RELATED APPLICATION

This application claims priority to International Patent Application No. PCT/US2020/018768 filed on Feb. 19, 2020.

TECHNICAL FIELD

The present disclosure relates generally to overcurrent protection systems, and more specifically to an overcurrent protection system for protecting against a shoot-through condition.

BACKGROUND

Space fairing vehicles and satellites are exposed to radiation events beyond those naturally present within the Earth's atmosphere. When such an event occurs, the event can interfere with certain types of electronics onboard the space-faring vehicle. One type of electronic subject to such interference is a transistor, such as a MOSFET. Alternatively, other types of transistors can be improperly turned on via a radiation event directly or in consequence of other circuit malfunctions induced by the event.

When stacked transistors are simultaneously turned on, an undesired circuit connection is created, and the undesirable circuit connection can lead to a shoot-through event. The shoot through event causes a high current overstress condition that can damage or destroy the circuit elements and/or any devices or conductors that consequently receive high current overstress during the shoot through event.

SUMMARY OF THE INVENTION

In one exemplary embodiment a shoot-through protection circuit includes a current sensor providing a sensor signal connected to a comparator input via at least a burden resistor, a switch protection circuit including a protection input connected to an output of the comparator and a plurality of outputs, each of the outputs connected to a corresponding switch in a plurality of stacked switches, and wherein the switch protection circuit is configured to drive each switch of the plurality of stacked switches open in response to a positive output signal from the comparator.

In another example of the above described shoot-through protection circuit the switch protection circuit comprises a transformer.

In another example of any of the above described shoot-through protection circuits the current sensor is connected to the comparator input via the burden resistor and an inductor.

In another example of any of the above described shoot-through protection circuits the burden resistor and the inductor are in series.

In another example of any of the above described shoot-through protection circuits the connection between the comparator input and the current sensor omits an inductor.

In another example of any of the above described shoot-through protection circuits the switch protection circuit comprises an isolation transformer.

In another example of any of the above described shoot-through protection circuits the isolation transformer includes an input winding connected to the comparator output, and a plurality of output windings, each of the output windings corresponding to one of the switches in the plurality of stacked switches.

In another example of any of the above described shoot-through protection circuits each switch in the plurality of stacked switches is a semiconductor switch.

In another example of any of the above described shoot-through protection circuits the comparator further comprises a reference voltage input, and wherein the comparator is configured to output a signal in response to a voltage at the comparator input exceed a voltage at the reference input.

In another example of any of the above described shoot-through protection circuits the comparator comprises an internal reference voltage, and wherein the comparator is configured to output a signal in response to the comparator input exceeding the internal reference voltage.

In another example of any of the above described shoot-through protection circuits the plurality of stacked switches are spacecraft power converter switches.

An exemplary method for protecting a set of stacked switches includes detecting a current using a current sensor, converting the current sensor to a voltage using a burden resistor, and driving each switch in a set of stacked switches open in response to the voltage exceeding a reference voltage.

In another example of the above described method for protecting a set of stacked switches converting the current sensor to a voltage using the burden resistor includes using a burden resistor and an inductor.

In another example of any of the above described methods for protecting a set of stacked switches converting the current sensor to a voltage comprises passing a current sensor output through the inductor and the burden resistor, thereby generating the voltage at a comparator input, and comparing the voltage to the reference voltage.

Another example of any of the above described method for protecting a set of stacked switches further includes generating a comparator output in response to the voltage exceeding the reference voltage, and providing the comparator output to an input winding of an isolation transformer.

Another example of any of the above described method for protecting a set of stacked switches further includes connecting a plurality of output windings of the isolation transformer to corresponding switches such that each output winding drives the corresponding switch open in response to the input winding receiving a comparator output.

Another example of any of the above described method for protecting a set of stacked switches further includes resuming standard operations of the set of stacked switches subsequent to the voltage falling below the reference voltage.

Another example of any of the above described method for protecting a set of stacked switches further includes delaying resuming standard operations of the set of stacked switches subsequent to the voltage falling below the reference voltage for a predetermined delay period.

These and other features of the present invention can be best understood from the following specification and drawings, the following of which is a brief description.

DETAILED DESCRIPTION

Figure 1:
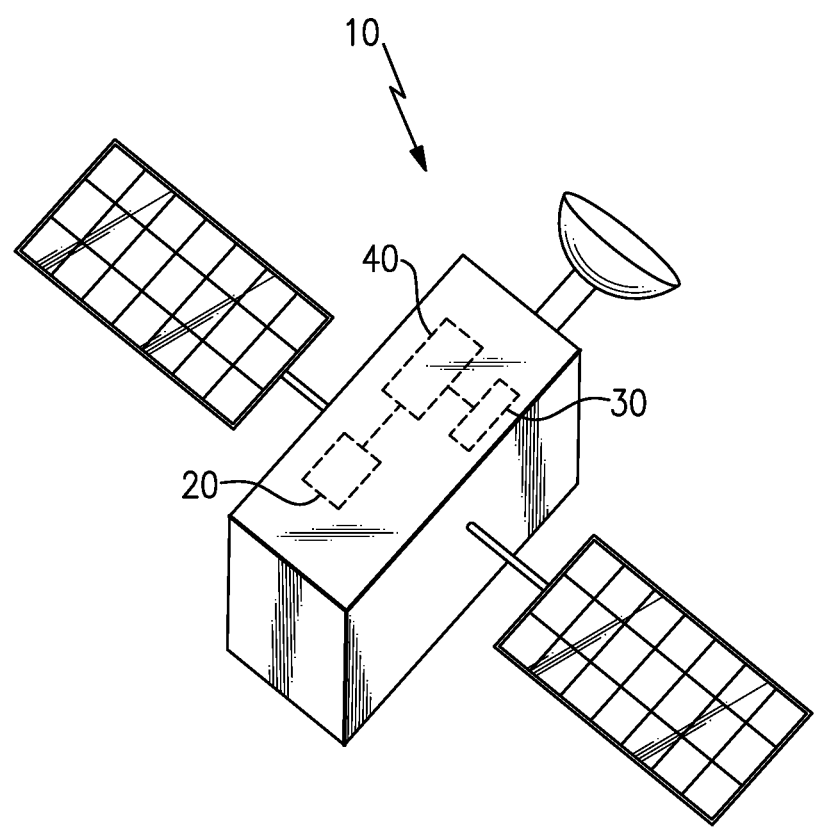
FIG. 1 illustrates an exemplary satellite including multiple onboard electronic components.

FIG. 1 schematically illustrates a satellite 10 including a power source 20 providing power to a high power load 30 through a power distribution circuit 40. By way of example, the high power load 30 can include an electric propulsion unit. In alternative examples, any other high power load 30 can be protected from a shoot through overcurrent in the same manner as described herein.

The inclusion of electric propulsion, and other high power loads, on spacecraft creates the need to incorporate high power sources 20 within the spacecraft 10. At the typical power levels for such devices, power supply circuit topologies that are immune to shoot-through events and/or otherwise resistant to shoot-through events are impractical for handling the conditioning and distribution of power to the necessary systems 30. Instead converters including full bridge circuit topologies, and other similar switch networks, are utilized to condition and distribute the power.

Full bridge topologies and other switch based topologies include stacked switches are subject to shoot through vulnerabilities due to the stacked nature of the switches. As used herein, a pair of stacked switches are vertically stacked (as illustrated in a circuit diagram) switches placed directly across an input bus. In standard operation, this topology is functional because only one of the stacked switches in a given stack will be closed at any given time. In space applications, or any other situation where a radiation event can occur, it is possible for both switches in a single stack to be closed at the same time for the duration of the radiation event or for the duration of recovery of driving circuits affected by the radiation event.

When both switches in a single stack are closed at the same time, a direct short circuit across the input power bus is created, and current through the switches rises rapidly. The rapid rise in current can damage the switches in less than a few hundred nanoseconds. Because of the speed at which the current rises, and the short time period before damage occurs to the stacked switches, the power distribution circuit 40 includes a protection circuit that detects a high primary current and differentiates the high primary current from other currents by detecting a high di/dt (change in current with respect to time) in the current signal and responding before permanent damage is incurred.

Once the high di/dt is detected, the protection circuit provides an override to the control input of the switches in the stacked switches. The override drives the voltage at the control input of each switch down, thereby opening all of the switches in the stack as quickly as possible. Once all of the switches have been opened, the control circuit maintains the switches open for a predetermined delay, after which normal operation is resumed. The predetermined delay can be any duration long enough for an expected radiation event to dissipate and for the circuit to fully recover and short enough to minimize disruption to the operations of the load 30.

Figure 2:
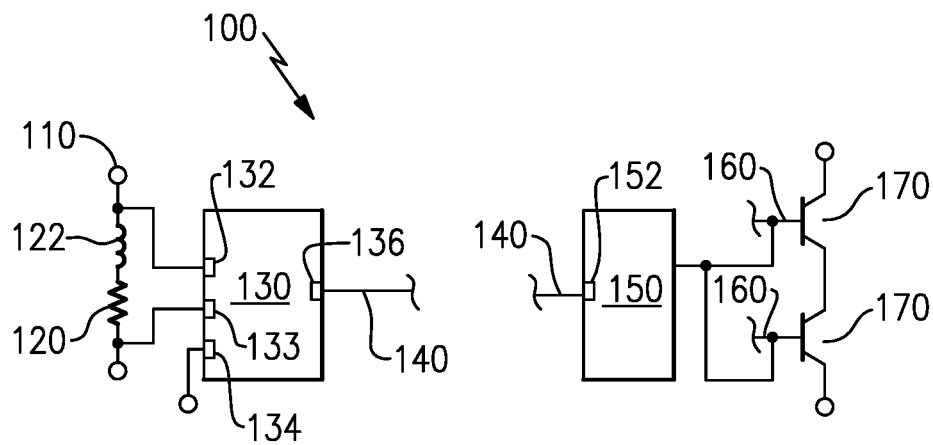
FIG. 2 schematically illustrates an overcurrent detection circuit configured to protect against an overshoot condition according to one example.

With continued reference to FIG. 1, FIG. 2 schematically illustrates an exemplary detection circuit 100 for detecting and responding to an overcurrent resulting from a shoot through condition due to stacked transistors 170 simultaneously closing. A current sensor provides a signal to an input 110 of the detection circuit 100. The current passes through the inductor 122 and the resistor 120, which generates a detection voltage across the inductor 122 and the resistor 120. The voltage difference is applied to a comparator 130 via a pair of inputs 132, 133. The comparator 130 compares the voltage at the inputs 132, 133 to a voltage at a reference input 134 and determines when the voltage from the current sensor 110 (at inputs 132, 133) and the burden resistor 120 exceeds the reference voltage. In alternative examples, the reference voltage can be stored internal to the comparator 130, and a constant reference voltage input 134 can be omitted.

In some examples, where a faster detection is required or where a means of detection is required that makes a more clear distinction between a shoot-through event and other, allowable high current events, an optional inductor 122 can be included in series with the resistor 120. The inductor 122 increase the speed of detection by further driving up the voltage at the input 132 in response to an increase in di/dt, whereas the resistor 120 increases the voltage in response to an increase in current i. In some examples, the inclusion of the inductor 122 can decrease the response time of the comparator by approximately 85 nanoseconds, bringing the total response time of the circuit 100 below 200 nanoseconds. In one particular example, the total response time of the circuit 100 is approximately 160 nanoseconds form onset to shut down, with a post-detection response time of approximately 100 nanoseconds.

When the voltage at the input 132 exceeds the threshold set by the reference voltage, the comparator 130 outputs a high signal form an output pin 136. The high signal 140 is provided to a switch protection transformer 150 at a protection input 152. The switch protection transformer 150 is connected to a control signal 160 of each of multiple stacked switches 170, and is configured to respond to a high input on the protection input 152 by driving the control inputs 160 to a low value and forcing the switches 170 open, thereby preventing current flow through the switch 170.

Figure 3:
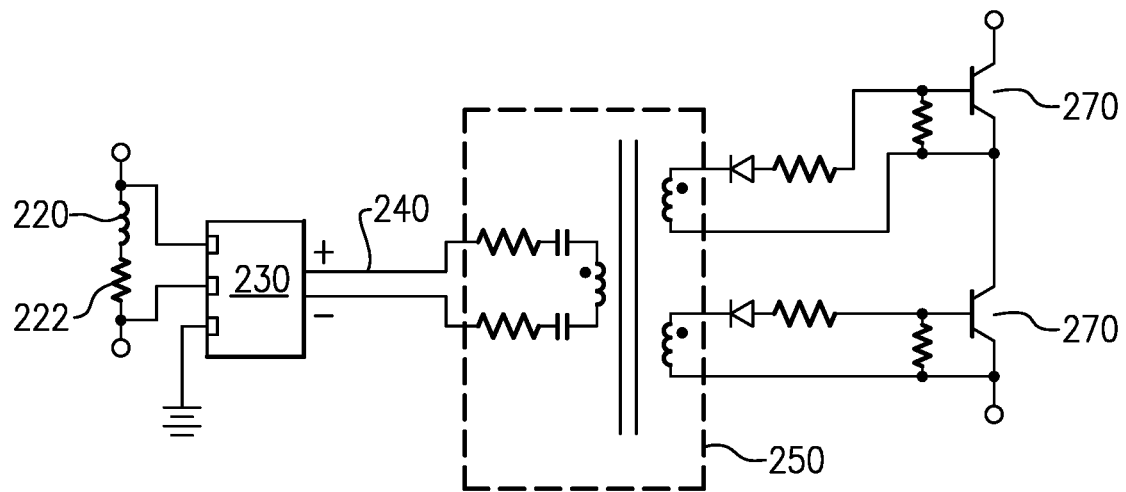
FIG. 3 schematically illustrates a detailed example circuit for implementing the overcurrent detection circuit of FIG. 2.
Figure 4:
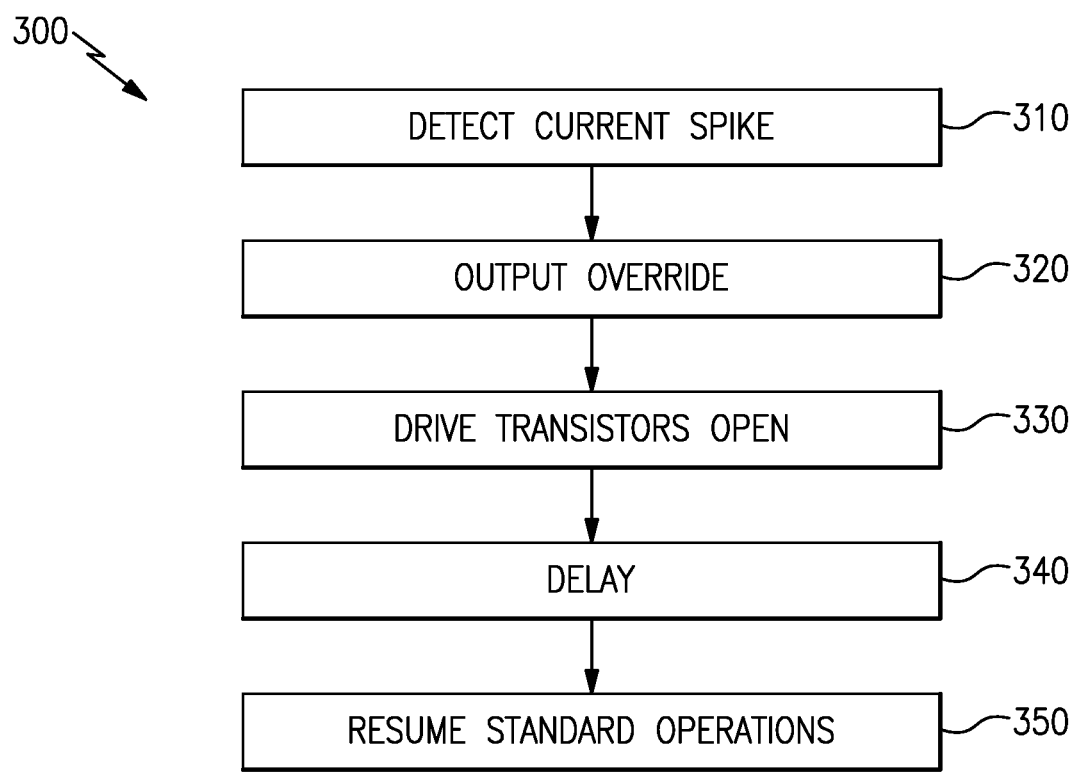
FIG. 4 illustrates a method for operating the overcurrent slope detection circuit of FIGS. 2 and 3.

With continued reference to FIG. 2, FIG. 3 schematically illustrates one example configuration of FIG. 2, in greater detail and constructed entirely of analog components. In alternative implementations, one or more components can be replaced with a corresponding digital component and provide similar functionality. As with FIG. 2, the initial detection of a shoot through current is performed by a comparator 230 receiving an input voltage generated by a burden resistor 220 and an inductor 222. When an increase in voltage is detected, the comparator 230 outputs a signal 240 to a transformer 250. The transformer 250 electrically isolates the switches 270, and causes current to drive to the control input of the switches 270, thereby turning off (opening) the switches 270, in response to a signal 240 being received at the transformer 250.

With reference to both the examples of FIG. 2 and FIG. 3, the comparator 130, 230 is, in some examples, configured to latch in a detected state for a predetermined period of time. The latching provides sufficient time for the radiation spike causing the shoot through event to dissipate and for the affected circuits to fully recover, while at the same time ensuring that the switches 170, 270 resume normal function as quickly as possible to minimize load interruption.

With continued reference to FIGS. 1-3, FIG. 4 illustrates a method 300 for operating the systems of FIGS. 1-3. Initially, a current spike is detected by comparing the voltage input against the reference voltage using a comparator in a "Detect Current Spike" step 310. When the detected voltage exceeds the reference voltage, the comparator outputs an override signal in an "Output Override" step 320. The override signal overrides the control input signal and forces the switches 170, 270 in the stack to open in a "Drive Transistors Open" step 330.

Once driven open, the transistors are maintained open for a delay period in a "Delay" step 340. The burden resistor 120, 220 maintains a voltage at the comparator input 132 for as long as the shoot through event is occurring. In such examples, the delay is maintained for exactly this length, plus propagation time. In alternative examples, the comparator can include a delay latch, that latches the output for a period of time beyond when the comparator 130 stops detecting an input voltage in excess of the reference voltage. In such an example, the additional delay provided by the latch allows for circuit recovery, system resets and/or any other necessary operations to occur before resuming standard operations in a "Resume Standard Operations" step 350.

Incorporation of the shoot through protection circuitry described herein allows the response time of protection circuits to be reduced to less than 100 nanoseconds, post-detection. Further incorporation of the inductor 122, 222 reduces pre-detection time from 145 nanoseconds to 80 nanoseconds. The decreased response time assists in preventing switch burnouts.

While illustrated in the exemplary circuits of FIGS. 2 and 3 as including two stacked transistors, it is appreciated that the shoot through detection and response described above can be applied to any number of stacked switches, and is not limited in implementation to the two transistor example.

Further, while described within the specific context of spacecraft and satellites, it is appreciated that the shoot through protection is functional in any situation where shoot through events may occur, including terrestrial based applications subject to radiation events.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A shoot-through protection circuit comprising:
a current sensor providing a sensor signal connected to a comparator input via at least a burden resistor;
a switch protection circuit including a protection input connected to an output of the comparator and a plurality of outputs, each of said outputs connected to a corresponding switch in a plurality of stacked switches; and
wherein the switch protection circuit is configured to drive each switch of the plurality of stacked switches open in response to a positive output signal from the comparator; and
wherein the current sensor is connected to the comparator input via the burden resistor and an inductor.

2. The shoot-through protection circuit of claim 1, wherein the switch protection circuit comprises a transformer.

3. The shoot-through protection circuit of claim 1, wherein the burden resistor and the inductor are in series.

4. The shoot-through protection circuit of claim 1, wherein the connection between the comparator input and the current sensor omits an inductor.

5. The shoot-through protection circuit of claim 1, wherein the switch protection circuit comprises an isolation transformer.

6. The shoot-through protection circuit of claim 5, wherein the isolation transformer includes an input winding connected to the comparator output, and a plurality of output windings, each of said output windings corresponding to one of the switches in the plurality of stacked switches.

7. The shoot-through protection circuit of claim 1, wherein each switch in the plurality of stacked switches is a semiconductor switch.

8. The shoot-through protection circuit of claim 1, wherein the comparator further comprises a reference voltage input, and wherein the comparator is configured to output a signal in response to a voltage at the comparator input exceed a voltage at the reference input.

9. The shoot-through protection circuit of claim 1, wherein the comparator comprises an internal reference voltage, and wherein the comparator is configured to output a signal in response to the comparator input exceeding the internal reference voltage.

10. The shoot-through protection circuit of claim 1, wherein the plurality of stacked switches are spacecraft power converter switches.

11. A method for protecting a set of stacked switches comprising:
detecting a current using a current sensor;
converting the current sensor to a voltage using a burden resistor and an inductor; and
driving each switch in a set of stacked switches open in response to the voltage exceeding a reference voltage.

12. The method of claim 11, wherein converting the current sensor to a voltage comprises passing a current sensor output through the inductor and the burden resistor, thereby generating the voltage at a comparator input, and comparing the voltage to the reference voltage.

13. The method of claim 11, further comprising resuming standard operations of the set of stacked switches subsequent to the voltage falling below the reference voltage.

14. The method of claim 13, further comprising delaying resuming standard operations of the set of stacked switches subsequent to the voltage falling below the reference voltage for a predetermined delay period.

15. A method for protecting a set of stacked switches comprising:
detecting a current using a current sensor;
converting the current sensor to a voltage using a burden resistor;
driving each switch in a set of stacked switches open in response to the voltage exceeding a reference voltage;
generating a comparator output in response to the voltage exceeding the reference voltage; and
providing the comparator output to an input winding of an isolation transformer.

16. The method of claim 15, further comprising connecting a plurality of output windings of the isolation transformer to corresponding switches such that each output winding drives the corresponding switch open in response to the input winding receiving a comparator output.

* * * * *